(12) United States Patent
Boulet

(10) Patent No.: US 8,642,443 B2
(45) Date of Patent: Feb. 4, 2014

(54) PROCESS FOR THE REALIZATION OF ISLANDS OF AT LEAST PARTIALLY RELAXED STRAINED MATERIAL

(75) Inventor: Romain Boulet, Vaulnaveys le haut (FR)

(73) Assignee: Soitec, Bernin (FR)

( * ) Notice: Subject to any disclaimer, the term of this patent is extended or adjusted under 35 U.S.C. 154(b) by 64 days.

(21) Appl. No.: 13/429,000

(22) Filed: Mar. 23, 2012

(65) Prior Publication Data

US 2012/0241918 A1   Sep. 27, 2012

(30) Foreign Application Priority Data

Mar. 25, 2011   (FR) .................................... 11 52496

(51) Int. Cl.
*H01L 21/30*   (2006.01)
(52) U.S. Cl.
USPC ..................... 438/458; 257/623; 257/E21.087
(58) Field of Classification Search
USPC ............ 257/623, E21.087, E29.024; 438/458
See application file for complete search history.

(56) References Cited

U.S. PATENT DOCUMENTS

| | | | | |
|---|---|---|---|---|
| 6,177,344 B1 * | 1/2001 | Xia et al. | ....................... | 438/646 |
| 2010/0032793 A1 * | 2/2010 | Guenard et al. | .............. | 257/507 |

FOREIGN PATENT DOCUMENTS

EP   2 151 852 A1   2/2010

OTHER PUBLICATIONS

Search Report, Appl. No. FR 1152496 (Nov. 4, 2011).
Kostrzewa et al., "Feasibility of III-V on-silicon strain relaxed substrates," Journal of Crystal Growth, 275(1-2):157-166 (Feb. 15, 2005).
Yin et al., "Strain relaxation of SiGe islands on compliant oxide," Journal of Applied Physics, 91(12):9716-9722 (Jun. 15, 2002).
Yin et al., "Fully-depleted Strained-Si on Insulator NMOSFETs without Relaxed SiGe Buffers," IEEE International Electron Devices Meeting, pp. 53-56 (Dec. 8-10, 2003).

\* cited by examiner

*Primary Examiner* — Shaun Campbell
(74) *Attorney, Agent, or Firm* — Winston & Strawn LLP

(57) ABSTRACT

The present invention relates to the field of semiconductor manufacturing. More specifically, it relates to a method of forming islands of at least partially relaxed strained material on a target substrate including the steps of forming islands of the strained material over a side of a first substrate; bonding the first substrate, on the side including the islands of the strained material, to the target substrate; and after the step of bonding splitting the first substrate from the target substrate and at least partially relaxing the islands of the strained material by a first heat treatment.

24 Claims, 8 Drawing Sheets

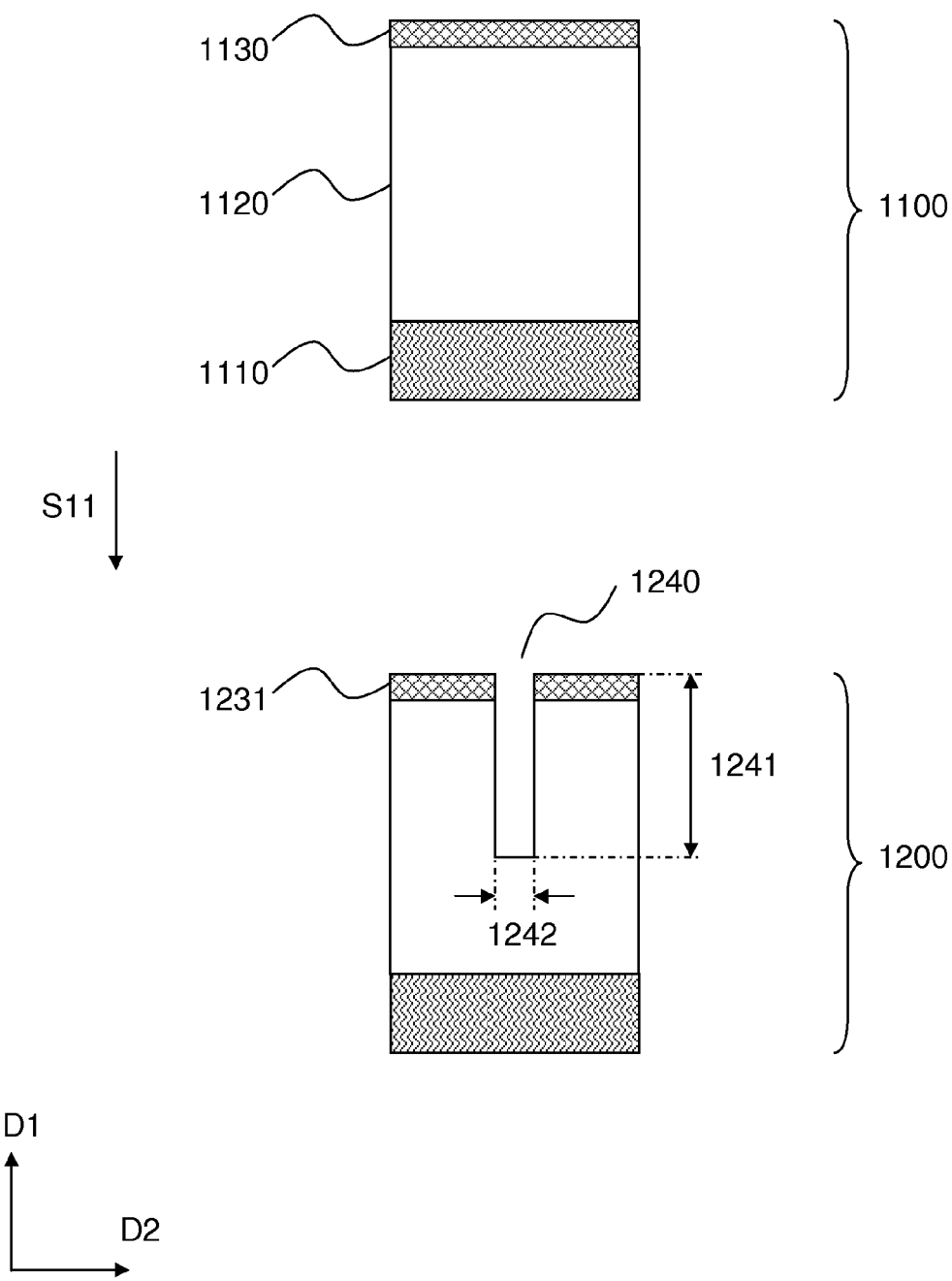

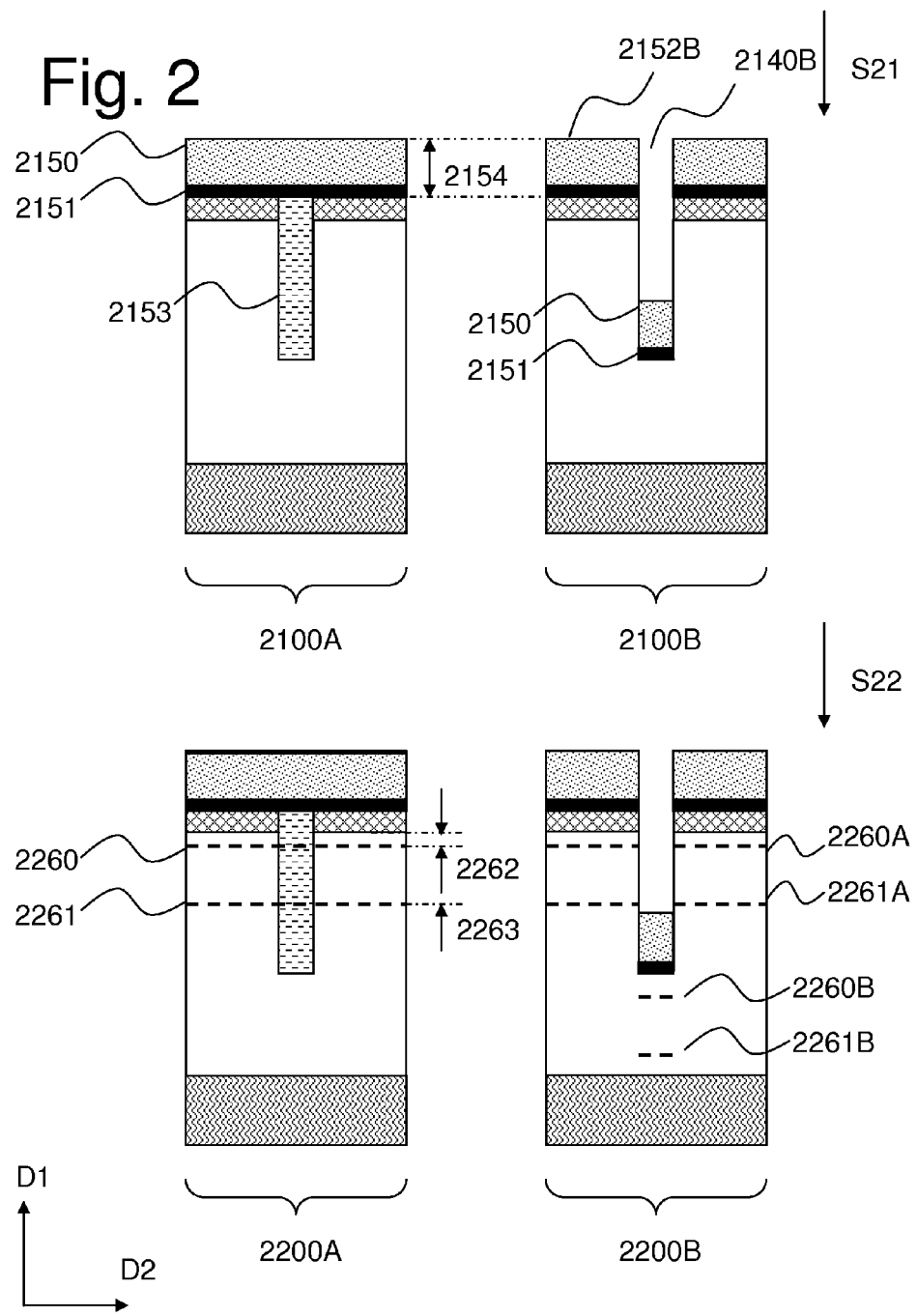

Fig. 3A
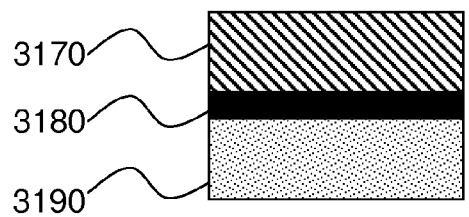
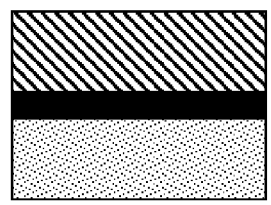
3170
3180
3190
3100A  3100B
3000
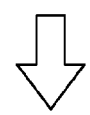
2150
3200A  3200B
D1
D2

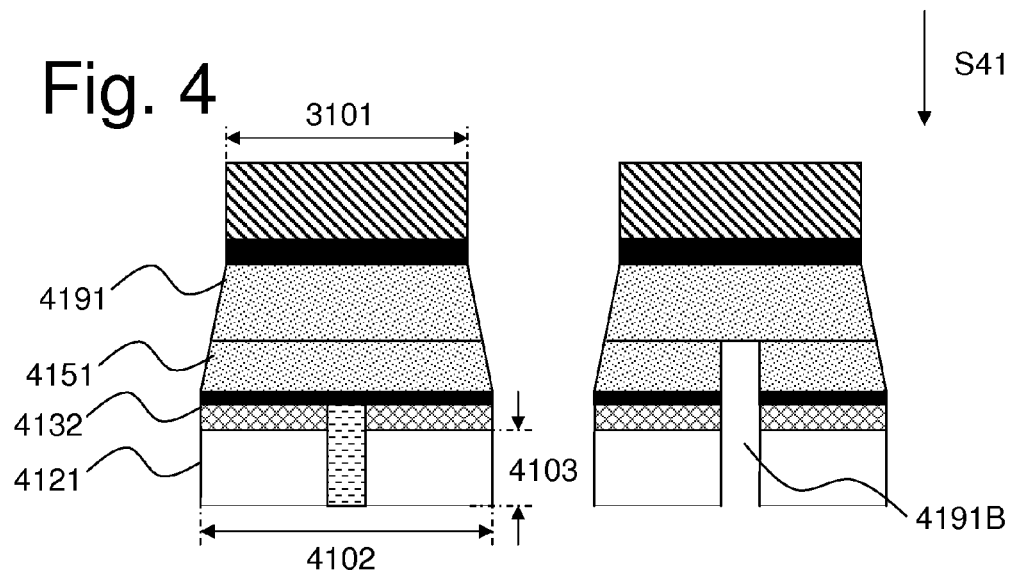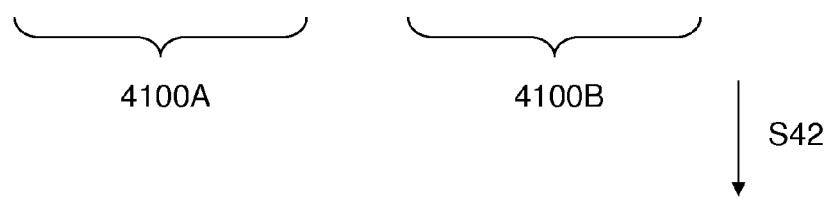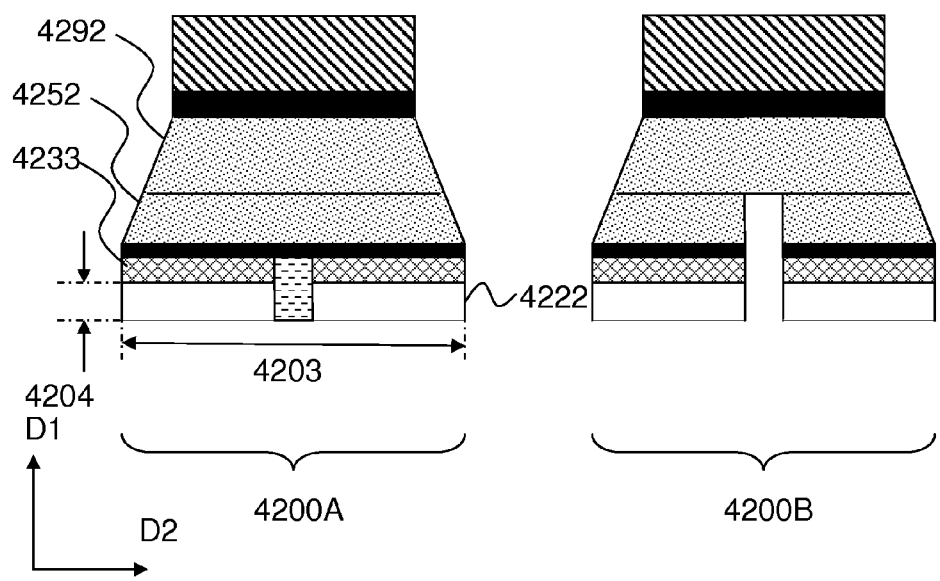
Fig. 4

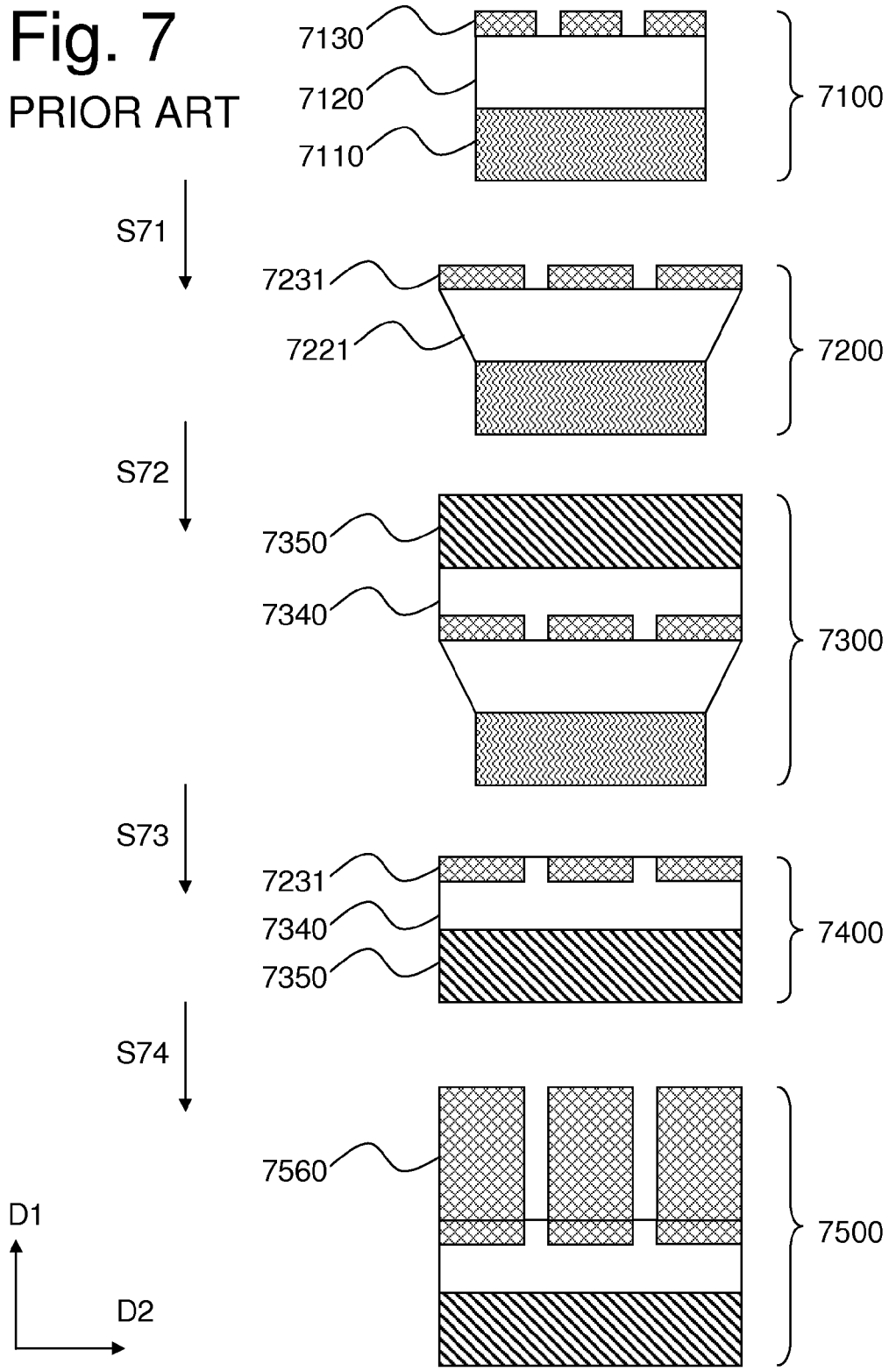

PROCESS FOR THE REALIZATION OF ISLANDS OF AT LEAST PARTIALLY RELAXED STRAINED MATERIAL

BACKGROUND

The present invention relates to the field of semiconductor manufacturing. More specifically, the present invention relates to a process for the realization of at least partially relaxed strained material.

III-V materials have recently become the center of much research due to a vast range of applications in which they outperform the classic silicon wafers. For instance, III-V materials have excellent performances for optoelectronic, photovoltaic and power applications, such as photovoltaic cells, particularly multi-junction photovoltaic cells, laser diodes, LED, diodes and many more.

Unlike silicon, however, realizing bulk wafers of III-V materials is very expensive or, in some cases, not possible. In those cases, one possible technique for obtaining bulk structures of III-V materials is to grow them epitaxially from a seed substrate.

For instance, as shown in FIG. 6, it is possible to use a donor substrate with strained III-V epitaxial layers, one III-V layer (GaN) and an additional strained layer 6130 (InGaN) on which a compliant or low viscosity layer 6120 made of borophosphosilicate glass BPSG, that is, $SiO_2$ that contains for example 4.5% of boron and 2% of phosphorous and has a glass transition temperature about 800° C., is deposited, or another compliant material. The strained layer is transferred on a new intermediate substrate 6110 via the borophosphosilicate layer, or another compliant material, by SmartCut™ processing resulting in structure 6100. When carrying out a relaxation step for instance by increasing the temperature of the structure 6100, the strained layer can be partially relaxed by flowing of the low viscosity layer, the flowing being a plastic deformation in contrast of the elastic relaxation of strained islands.

Such a relaxation step S61, however, suffers from a problem known as buckling. More specifically, the resulting at least partially relaxed layer of InGaN 6231 has an undulated shape, due to the strain of the lattice being released at least partially in direction D1. Furthermore, in structure 6200, the layer 6221 may also be buckled.

The above mentioned buckling problems can be reduced by a manufacturing process such as the one illustrated in FIG. 7 and known from patent document EP2151852A1. As can be seen in FIG. 7, a structure 7100 includes a support substrate, e.g. of Si, SiC, Ge or sapphire, 7110, a compliant or relaxing layer e.g. BPSG, an $SiO_2$ compound comprising B (BSG) or P (BPG), 7120 and islands of strained material, e.g. InGaN, 7130. The structure 7100 is then subjected to a relaxation step S71 by heating the structure 7100 and flowing of the compliant layer. The resulting structure 7200 includes islands 7231 of at least partially relaxed strained material. The at least partial relaxation of the islands 7231 results in an elongated compliant layer 7221, at least at the interface with the islands 7231.

During a further deposition step S72, a buried layer 7340 is deposited on the islands 7231 of at least partially relaxed material. On top of the buried layer 7340, a second support substrate 7350 is subsequently bonded to bury layer 7340. The resulting structure 7300 therefore comprises islands 7231 of at least partially relaxed material which are connected to both the first support substrate 7110 via layer 7221 and the second support substrate 7350 via layer 7340. During a subsequent transfer step S73, the structure 7400 including the islands 7231 of at least partially relaxed material, the buried layer 7340 and the second support substrate 7350 is detached from structure 7300. The detachment can be achieved, for instance, by laser lift off that comprises irradiation of an absorbing layer between the substrate and the islands 7231 with a laser.

Alternatively, the detachment could be achieved by removing both the support substrate 7110 and the elongated seed layer 7221, for instance, by Chemical Mechanical Polishing (CMP) or also by implantation ions in the seed layer 7120 and by subsequently heating structure 7300.

At this point, an epitaxial growth of at least partially relaxed structures 7560, by using the islands 7231 as seeds, can be carried out in a step S74. Also, by controlling the amount of relaxation during step S71, the physical characteristics such as lattice parameter, low dislocation density, degree of relaxation, of the at least partially relaxed structures 7560 can be controlled.

Such a process, however, still has some drawbacks. It requires a high number of steps and the buckling phenomenon can still occur depending of the size of the islands.

Moreover, when the strain of the strained material is high, cracking and delamination of the strained InGaN can be observed. The strain may depend on the lattice mismatch between the seed layer and the islands and the thickness of the islands. The higher the thickness, the higher is the strain. In the case of an InGaN island and GaN seed layer, the higher the amount of Indium in InGaN the higher the lattice mismatch and strain.

There therefor is a need to improve these prior art processes by reducing the amount of steps and by further reducing the buckling phenomenon. The present invention now satisfies this need.

SUMMARY OF THE INVENTION

The present invention now provides a method of forming islands of at least partially relaxed strained material on a target substrate by forming islands of the strained material over a face of a first substrate; bonding the face of the first substrate to a target substrate; and detaching, by splitting, the first substrate from the target substrate and at least partially relaxing the islands of the strained material by a first heat treatment.

By carrying out the inventive method, it is possible to achieve islands of at least partially relaxed material which are connected to a transfer substrate and the buckling phenomenon can be further reduced thanks to the presence of both the first substrate and the target substrate on both the sides of the islands.

In some embodiments, the method can further comprise forming a layer of a gripping material or a layer of relaxing material over the islands of the strained material, with the layer of gripping material provided for improving adhesion between the islands and the layer of relaxing material.

Thanks to the formation of the layer of a relaxing material, bonding between the two substrates can be facilitated. In addition, the target substrate can include over its surface a layer of a bonding material, so that bonding can occur between the layer of relaxing material and the layer of a bonding material.

In some embodiments, the relaxing material and the bonding material can be BPSG or any material that flows at a glass transition temperature comprised between 600 and 1000° C.

In some embodiments, the bonding layer can comprise an absorbing layer of electromagnetic irradiation such as $Si_xN_y$:H.

In some embodiments, the step of at least partially relaxing the islands can include the steps of heating the bonded first substrate and target substrate at about the glass transition temperature of the relaxing layer, preferably 600° C.-1000° C., during few hours, e.g., 2 to 6 hours.

In some embodiments, the splitting step can include an elastic relaxation.

In some embodiments, after the splitting step, the surface topology of the islands of at least partially relaxed material can be kept under 10 nm RMS and preferably under 6 nm as measured by Zygo metrology over a field of approximately 140 micrometers by 100 micrometers In some embodiments, the method can further comprise the step of forming a seed layer, on the face of the first substrate, before forming the islands so that the islands of the strained material can be formed on the seed layer.

In some embodiments, the seed layer can be any of GaN, any semi-conductor materials, silicon, III-V alloys, III-N materials, binary, ternary, quaternary alloys as AlGaN or $Al_n$-GaN.

In some embodiments, the method can further comprise implanting ionic species in a region within the seed layer on the first substrate, or in the first substrate, to form a weakened layer prior to bonding the first substrate to the target substrate. By implanting ions in a region within the layer of the at least partially relaxed material, it is possible, in addition to at least partially relaxing the islands, to detach and transfer the islands from the first substrate to the target substrate, by weakening of the layer of the at least partially relaxed material Thanks to the fact that the relaxing and transferring are achieved in a single step, the number of necessary steps can be reduced.

In some embodiments, during the relaxing, the heat treatment can be carried out such that the weakened layer is detached.

By this method, relaxing of the islands and weakening of the ion implanted region can be achieved during the same heat treatment. Moreover, by performing this method, the islands can be at least partially relaxed while hindering the occurrence of buckling and without causing delamination. This is because the target substrate acts as a support and a stiffening substrate at the same time and this promotes lateral relaxation without buckling.

In some embodiments, during the relaxing, the splitting and the relaxation can occur simultaneously.

In some embodiments, the islands of at least partially relaxed strained material bonded to the target substrate can be detached together and physically moved away from the first substrate.

In some embodiments, the strained material and the seed layer that can be detached together from the first substrate can have a bilayer thickness in the range of 150-500 nm.

In some embodiments, the forming of the islands can include forming trenches in the first substrate or in the seed layer following the shape of the islands of strained material. For this embodiment, the weakened layer can be formed below the trenches.

In some embodiments, during the first heat treatment a heating temperature can be changed at a rate in the range of 1° C./min to 50° C./min, and preferably in the range of 1° C./min to 20° C./min.

In some embodiments, the method can further include applying a second heat treatment, at about the glass transition temperature of the relaxing layer after physically moving away the at least partially relaxed strained material from the first substrate In some embodiments, the method can further comprise thinning the seed layer before or after applying the second heat treatment. By carrying out the thinning before the second heat treatment, the relaxation of the islands can be facilitated by the reduced amount of the stiffening seed material.

In some embodiments, the thinning and second heating can be repeated until the islands are substantially relaxed.

In some embodiments, the layer of a relaxing material or the layer of a bonding material can be partially or completely patterned following the islands of strained material before thinning or applying the second heating to help the complete relaxation In some embodiments, the strained material can be strained InGaN preferably including indium between 3-20%, more preferably between 5-15%, or it can be strained SiGe or strained III-N material.

In some embodiments, either of the first substrate and the target substrate can be any of sapphire, silicon, SiC, or Ge, preferably with the first and the target substrate being identical or having a similar coefficient of thermal expansion. A similar coefficient of thermal expansion helps to avoid different expansion of the substrates during heat treatment that would weaken the structure. The identical material for the substrates provides no difference in expansion.

In some embodiments, the size of the islands can be in the range of about 300 nm by 300 nm, to a few millimeters by few millimeters and could have any shape.

In some embodiments, the islands of at least partially relaxed material can be bonded to a final substrate and the target substrate can be detached by laser lift off.

For example any of the first substrate, intermediate substrate and the target substrate may be in sapphire that is transparent to the electromagnetic irradiation of an Ar/F laser providing light of 193 nm. If the process flow uses a silicon substrate or SiC substrate, etching or polishing of the substrate may be used to remove it or the substrate may not be recycled and can be destroyed.

A second transfer of the relaxed InGaN by a second bonding on a third substrate and a Laser lift off process can permit to re-growth by epitaxy the relaxed III-V on the Ga face.

In some embodiments, the islands at least partially relaxed material can be bonded to the final substrate by a non-compliant oxide layer with a glass transition temperature above 1000-1200° C.

The present invention can further relate to a working layer of relaxed III-V, II-VI or IV material which can be epitaxially grown on the islands of at least partially relaxed strained material obtained by the method of any of the previous embodiments. Thus, the structure comprises a working layer of relaxed III-V, II-VI or IV material on islands of at least partially relaxed strained material on a substrate.

The present invention can further relate to an optoelectronic or photovoltaic device such as a Led, Laser, solar cell, formed in or on the working layer of the structure according to the previous embodiment.

BRIEF DESCRIPTION OF THE DRAWINGS

The accompanying drawings are incorporated into and form a part of a specification to illustrate several embodiments of the present invention. These drawings together with the description serve to explain the features, advantages and principles of the invention. The drawings are only for the purpose of illustrating preferred and alternative examples of how the invention can be made and used, and are not to be construed as limiting the invention to only the illustrated and described embodiments. Further features and advantage will become apparent from the following and more particular description of the various embodiments of the invention, as illustrated in the accompanying drawings, in which like reference prefer to like elements and wherein:

FIGS. 1-5 are schematic drawings illustrating a process of forming islands of at least partially relaxed strained material according to the present invention;

FIG. 7 is a schematic drawing illustrating a process of forming islands of at least partially relaxed strained material according to the state of the art.

DETAILED DESCRIPTION OF THE PREFERRED EMBODIMENTS

Figure 3B:
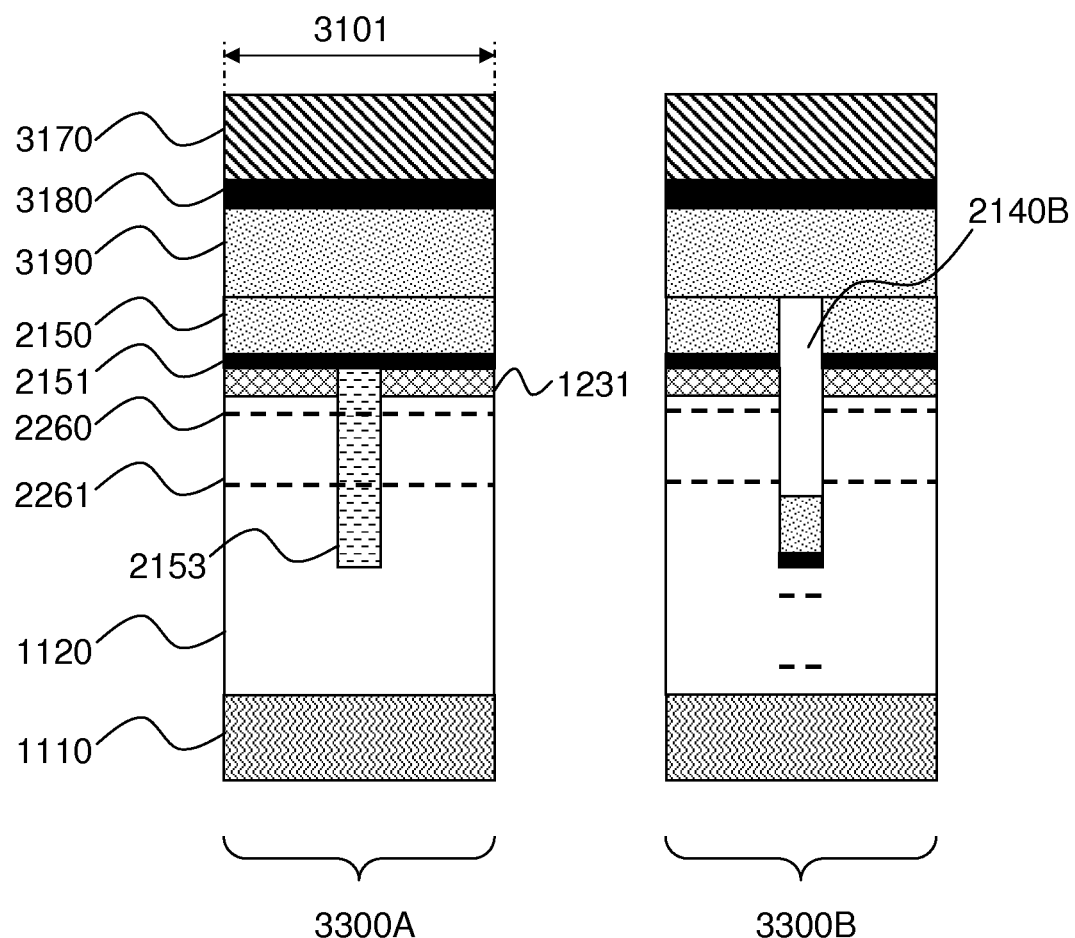

FIGS. 1-5 illustrate detailed steps of a process of forming islands of at least partially relaxed strained material according to an embodiment of the present invention.

As can be seen in FIG. 1, a structure 1100 includes a first support substrate 1110, a seed layer 1120 and a strained material layer 1130. The support substrate 1110 could be sapphire ($Al_2O_3$), or silicon, SiC, or Ge. The seed layer 1120 is a monocrystalline layer and could be GaN. The strained material layer 1130 is a crystalline layer, preferably a monocrystalline material, and could be InGaN, with a high Indium concentration in InGaN if the aim is to obtain a high lattice parameter after the relaxation, for epitaxy of relaxed InGaN material to form working layer on top of it, preferably higher than 7-8% up to 15%. The thickness of the seed layer 1120 could be in the range of at least 2 μm in order to decrease the dislocation density on the surface. The thickness of the strained material layer 1130 could be in the range of 50 nm to 300 nm depending of the In content or percentage of the InGaN alloy.

The atomic lattices of the seed layer 1120 and the strained material layer 1130 are different when the materials of the layers 1120 and 1130 are in their natural-unstressed state, that is, with nominal lattice parameter. When the layer 1130 is grown epitaxially on top of layer 1120, with a pseudomorphic growth, however, this results in the crystalline material of layer 1130 being strained. For example, if layer 1120 is GaN and layer 1110 is sapphire; GaN is grown on sapphire that has not the same lattice parameter of GaN so that GaN layer is strained. Furthermore, for instance, if layer 1130 is InGaN, it may keep the lattice parameter of GaN seed layer that kept the lattice parameter of sapphire substrate 1110. As InGaN has more lattice mismatch with respect to sapphire than GaN, the InGaN layer may be more strained than the GaN layer.

Alternatively, the structure 1100 could comprise further layers between the support substrate 1110 and the seed layer 1120 or between the seed layer 1120 and the strained material layer 1130.

During a subsequent patterning step S11, one or more holes or trenches 1240 are then realized in the structure 1100 e.g., using lithography or laser ablation, thereby obtaining structure 1200. As can be seen in FIG. 1, the hole 1240 cuts through the strained material layer 1130 and at least within in the seed layer 1120, thereby realizing at least two islands 1231 of strained material. The depth 1241 of the hole 1240 along direction D1 is at least longer than the thickness of the strained material layer 1130. More preferably, the depth is longer than the depth of the weakened zone formed by subsequent implantation in the seed layer 1120. The width 1242 of the hole 1240 along direction D2 could be in the range 5 μm to 50 μm for example, preferably between 5-10 μm. The smaller the width 1242 along direction D2, the easier the later step of transferring of the islands of strained material 1231. Typically, a width 1242 of the hole 1240 in the order of 8 μm can be achieved.

As illustrated in FIG. 2, one or more layer deposition steps S21 are carried out to deposit at least one of a layer of a first bonding or gripping material 2151, a layer of a second bonding or relaxing material 2150, and a layer of a dielectric material 2153 or any oxide layer and possibly the same than the gripping material or relaxing material. Depending on the way the deposition steps are carried out, two resulting structures could be obtained: structure 2100A and structure 2100B.

In the first variant, structure 2100A is obtained by filling the hole 1240, via a step of depositing a layer of a dielectric material 2153 on structure 1200, the dielectric material 2153 having a thickness corresponding to at least the depth 1241 of the hole 1240, and a 30 step of performing a CMP so as to remove excess dielectric material 2153 from the islands 1231 of strained material, thereby leaving the dielectric material only inside the hole 1240. Following such a filling step, a layer of a gripping material 2151 and subsequently a relaxing material layer 2150 is deposited, the two layers 2151 and 2150 having a combined thickness 2154 along direction D1.

In the second variant, structure 2100B is obtained by depositing a gripping material 2151 and subsequently depositing a layer of a relaxing material 2150 having a combined thickness 2154 along direction D1. In FIG. 2, the combined thickness 2154 is shorter than the depth 1241 of the hole 1240. The two layers of material 2150, 2151 would thereby result in islands 2152B of materials 2150, 2151 such as represented in structure 2100B.

The dielectric material 2153 could be any material which can be polished and planarized by CMP and may be e.g., silicon oxide. A preferred relaxing material 2150 in this embodiment is BPSG, but it could also be any compliant layer for the relaxation step. Generally speaking, it could be any material that flows between a glass transition temperature 600 and 1000° C., for instance, a BPSG layer that has a content of 4.5% boron and 2% phosphorous has a glass transition temperature of about 850° C. More preferably the material does not release any contaminating particles during thermal treatment.

The usage of such material may enable a better bonding with the target substrate 3170, like described later, in particular in case the same material 3190 is also provided on the target substrate 3170. The thickness of the layer of the relaxing material 2150 along direction D1 is typically in the range of 300 nm to more than 1 μm, preferably has a value of about 500 nm.

The gripping material 2151 in this embodiment is $SiO_2$, but could also be any of material that allows a strong adhesion between III-N material and BPSG. The $SiO_2$ may be deposited by PECVD (Plasma-enhanced chemical vapor deposition) and a thermal treatment may be applied in order to degassing and make denser the layer to provide a strongest adhesion effect. The use of $SiO_2$ allows for a better adherence between the strained material layer 1130, or the islands 1231, and the gripping material 2151. The thickness of the layer of the gripping material 2151 along direction D1 is less than the one of the relaxing material 2150 and could be in the range of 10 nm to 100 nm, preferably a value of 50 nm In a third variant not shown in FIG. 2, only the relaxing material 2150 could be deposited, instead of the layer of gripping material 2151 and the relaxing material 2150. Still alternatively, more than two materials could be deposited with each material contributing to the various bonding or relaxing properties of the substrate.

The deposition step S21 of the gripping layer 2151 and relaxing material 2150 could be carried out by any suitable technique like LPCVD (Low Pressure Chemical Vapor Deposition), PECVD or any other techniques.

Following the deposition of the relaxing material 2150, a heating step could be carried out for any of structures 2100A and 2100B in order to densify the materials 2150 and 2151 at the same time. The heating step could be carried out by inserting any of structures 2100A and 2100B in a heating chamber at a temperature higher than the deposition temperature and below the flowing temperature during a time in the range of 1 hour to 4 hours, preferably one hour. This annealing depends on the properties of the materials in the structure 2100A and 2100B.

An ion implantation step S22 could then be performed on any of structures 2100A and 2100B resulting respectively into structures 2200A and 2200B. The implantation step implants ionic species, e.g. hydrogen and/or helium ions, inside the seed layer 1120 to form a predetermined weakened area 2260, 2261 that results in the detachment or splitting of the first substrate from the target substrate after bonding.

As can be seen in FIG. 2, different implantation regions 2260 and 2261 could be achieved, having different depths along direction D1, depending on the implantation energy. For instance, a shallower depth 2260 is achieved with implantation energies in the range of 60 KeV to 90 KeV. A deeper depth 2261 could be achieved with implantation energies in the range of 100 KeV to 130 KeV.

By controlling the depth of the implantation region within the seed layer 1120, the thickness 2262 or 2263 respectively of the detached seed layer 1120 and the strained material layer 1130 or islands 1231 up to the implantation region 2260 or 2261, can be controlled. Typically, the thickness 2262, 2263 is in a range of 100 nm to 500 nm. This implantation may be done through the 2150 relaxing layer. The thickness 2262 and 2263 begins from bottom of the strained InGaN 1130 layer to the top of the arrows 2262 and 2263 on FIG. 2. This layer will be transferred with the strained III-V layer and GaN 1120 layer that provides a part of stiffening effect present in the process flow. The deeper the implantation, the less the strained material layer is damaged by the implantation. For a deeper implantation, however, there may be a higher strain in the bonded substrate composed by layers 1120, 1130 and the target substrate, which may result in delamination.

Alternatively, the depth of the implantation region and the thickness of layers 2150, 2151, 1130 and 1120 could be controlled so as to achieve an implantation region within the support substrate 1110.

Concerning structure 2100B, due to the presence of hole 2140B, the ion implantation step S22 results into implantation regions 2260A and 2261A as well as 2260B and 2261B. Implantation regions 2260A and 2261A substantially correspond to implantation regions 2260 and 2261. Due to the presence of hole 2140B, however, the ions which are implanted through the hole will reach a deeper level in structure 2200B. More specifically, they will result into implantation regions 2260B and 2261B.

Subsequently a bonding step S31 is carried out on any of structures 2200A and 2200B by bonding structure 2200A to structure 3100A or structure 2200B to structure 3100B respectively, as illustrated in FIG. 3A.

As can be seen in FIG. 3A, structure 3100A or 3100B includes a target substrate 3170, a detachment layer or absorbing layer 3180 and a bonding layer 3190. The target substrate 3170 in this embodiment is sapphire, but could also be any substrates if the coefficient of thermal expansion is similar to the first substrate, in which case it may be a transparent substrate if one laser lift off is required in the process flow. Optionally, the first and the target substrate are identical or have similar coefficient of thermal expansion to avoid any different thermal expansion and any delaminating of layer during thermal treatment. The detachment layer 3180 in this embodiment is $Si_xN_y$:H, but could also be any one of detachment layers and target substrate matching the wavelength of the Laser lift equipment. The transparent sapphire target substrate can at a later stage removed by a laser lift off process during which laser light enters via the transparent target substrate 3170 and be absorbed by the layer 3180. The thickness of the SiN layer 3180 could be in the range of 50 nm to 300 nm, preferably 200 nm.

The bonding layer 3190 in this embodiment is BPSG, but could also be any compliant material layer. The usage of such material is advantageous in proving a better bonding and relaxing effect with the relaxing layer 2150 of structures 2100A, 2100B. The thickness of the bonding layer 3190 along direction D1 could be in the range of 500 nm to 3 μm, preferably 1 μm.

The bonding step S31 could include a CMP step consisting in performing a CMP on both the bonding layer 3190 and the layer of relaxing material 2150 in order to achieve a roughness of the surface of both layers 2150 and 3190 in the range of 5 Angstrom RMS maximum, preferably a value of less than 5 Angstrom RMS, measured by an Atomic Force Microscope (AFM) in a field in the range of 5×5 square micrometers. The choice of such values for the roughness improves bonding.

Subsequently, the structure 3100A is brought in contact with structure 3200A or the structure 3100B is brought in contact with structure 3200B to initiate bonding. The resulting bonded structures are illustrated in FIG. 3B.

Structure 3300B is substantially similar to structure 3300A, except for the area 2140B between two islands.

Subsequently, through a splitting and relaxation step, S41 structures 4100A and 4100B are obtained from structures 3300A and 3300B respectively, as illustrated in FIG. 4.

The splitting and relaxation step might be realized by inserting structure 3300A or structure 3300B into a heating chamber and carrying out the following heating steps:
 (i) starting at room temperature; then
 (ii) heating up to a temperature in a range of 50° C. to 250° C., and holding the temperature for a duration in a range of 30 min to few hours; then
 (iii) heating up to a temperature in a range of 280° C. to 700° C., and holding the temperature for a duration in a range of few min to more than 20 hours depending on the implant conditions; then
 (iv) heating up to a temperature in a range of 400° C. to 900° C. depending on the compliant layer properties, and holding the temperature for a duration in a range of 2 to 6 hours.

From one heating step to the next the temperature changes are realized at a rate in the range of 1° C./min to 50° C./min and more preferably, at 1° C./min to 20° C./min, for all the ramp up and ramp down or cooling.

The effect of the splitting and relaxation step S41 can be seen in structures 4100A or 4100B of FIG. 4. As can be seen in FIG. 4, structure 4100A or 4100B results from the detachment of the support substrate 1110 and a part of the seed layer 1120 from structures 3300A and 3300B respectively. The part of the seed layer 1120 detached consists in the part of the seed layer 1120 which is located between the ion implantation region 2260, 2261 and the support substrate 1110.

Moreover, the splitting and relaxation step S41 causes the islands 1231 of strained material to at least partially relax thank to the flowing of the relaxing layer 2150 and bonding layer 3190, thereby forming islands 4132 of at least partially relaxed strained material. This can be seen in FIG. 4, wherein the length 4102 along direction D2 of the strained seed layer 4120 is longer than the original length 3101 of any of structures 3300A and 3300B along direction D2.

The advantage of performing both the splitting and the relaxation in a single heating step is that the number of steps can be reduced. Moreover, by maintaining a transferred part of the seed layer 1120 (4121) and the first substrate 1110 in structure 3300A and 3300B, the relaxation of islands 1231 of strained material may be achieved without buckling, and in an elastic way so that no new crystal defects such as dislocations are formed, no cracks are formed in the island materials, and no delaminating occurs. Indeed, the presence of the first substrate 1110 on top of the structure during relaxing step provides a great stiffening effect that allows to avoid buckling and to maintain the stability of the composite structure.

Furthermore, if the splitting and relaxation step occur simultaneously, the handling and risk of damage from possible scratches with the chuck are significantly reduced.

Concerning structure 4100B, the same effects are observed, except that structure 4100B further includes a hole 4191B deriving from hole 2140B between the islands.

Subsequently and optionally, an additional relaxation and thinning step S42 could be carried out on structures 4100A or 4100B thereby resulting in structures 4200A and 4200B. The compliant layers 4191 and 4151 on the target substrate may also be at least patterned following the borders of existing islands to help the relaxation if needed.

The relaxation and thinning step S42 might be realized by inserting any of structures 4100A and 4100B into a heating chamber and heating the chamber at a range of 800° C. to 1000° C., during a period in a range of 1 hour to 8 hours. Moreover, before, during or after the heating process, the strained seed layer 4121 could be thinned, resulting in a reduced thickness 4204 compared to the thickness 4103 of structures 4100A or 4100B.

This has the effect of flowing of the compliant BPSG layer 4151 and compliant layer 4191, so that at least part of the compressive strain in the islands 4132 of at least partially relaxed strained material can relax and the lattice parameter is enlarged. This can be seen in FIG. 4, wherein, for illustration purposes, the length 4203 along direction D2 of the at least relaxed islands 4233 is longer than the length 4102 of the less relaxed islands 4232.

The same effects are achieved for structure 4200B except that structure 4200B further includes a hole 4191B deriving from hole 2140B.

According to further variants, the relaxation and thinning step S42 could also be carried out more than once, in order to progressively further relax the islands 4132 of at least partially relaxed strained material while still preventing buckling due to the presence of layer 4222.

Figure 5:
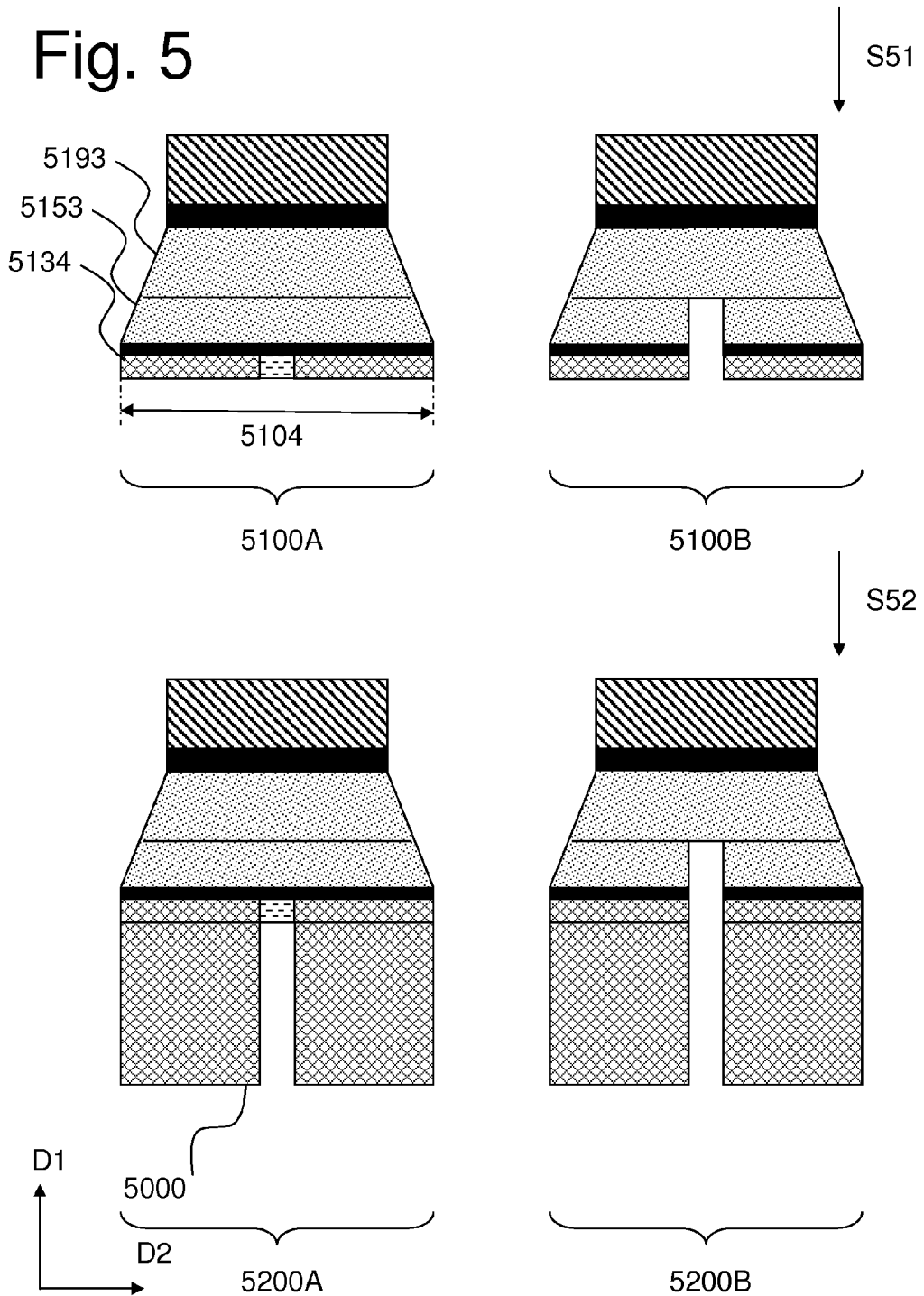
Figure 6:
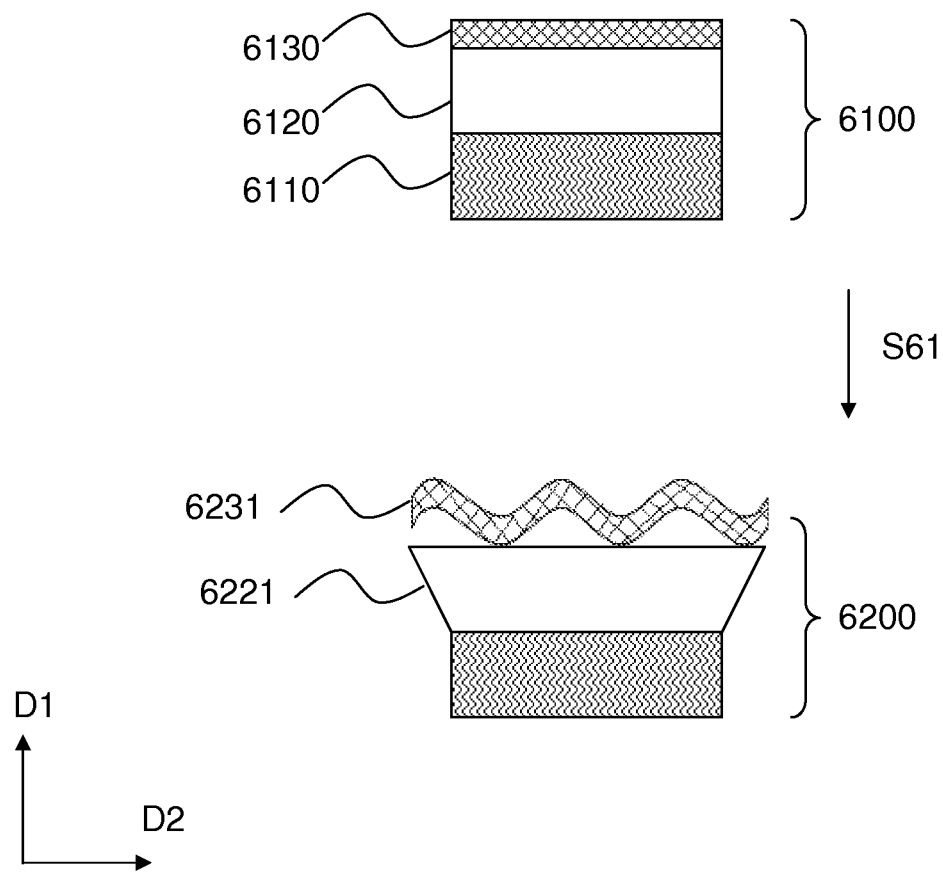
FIG. 6 is a schematic drawing illustrating a process of forming a layer of at least partially relaxed strained material according to the state of the art.

Subsequently, as can be seen in FIG. 5, a further relaxation and thinning step S51 is carried out on structures 4200A and 4200B thereby resulting in structures 5100A and 5100B. The relaxation and thinning step S51 might be realized by inserting any of structures 4200A and 4200B into a heating chamber and heating the chamber at a range of 800° C. to 1000° C., during a period in a range of 1 to 8 hours.

Moreover, before, during or after the heating process, the layer 4222 could be thinned eventually resulting in the layer 4222 to be totally removed. This has the effect of carrying at least partially the strain of the islands 4132 of at least partially relaxed strained material to the layer of strained gripping material, and/or to the strained bonding layer 4292, and/or layer 4252, resulting into a layer of strained gripping material, and/or a strained bonding layer 5193 and/or layer 5153 respectively. This can be seen in FIG. 5, wherein the length 5104 along direction D2 of the islands 5134 of at least partially relaxed strained material of structures 5100A and 5100B is longer than the length 4203 of the strained seed layer 4222 and of the islands 4233 of at least partially relaxed strained material of structures 4200A and 4200B.

The same effects are achieved on structure 5100B except that it further includes a hole 4191B deriving from hole 2140B.

The relaxed islands may be transferred onto a final substrate such as sapphire to recover the right polarity and to have a bonding layer that has a high viscosity between island and final substrate, the III-element facing Ga. The bonding may be a direct bonding or performed with a high viscosity layers, or non-compliant layer or that has a glass transition temperature above 1000° C., such as SiO2 so that no flowing occurs during thermal treatment of epitaxy. The second transfer can be done by laser lift off if an absorbing $Si_xN_y$:H layer may be provided between the target substrate and the islands. Any of the layers 3180, 5193, 5153, 2151 and 5134 and the new bonding layers may be transferred on the final substrate.

During the growth step S52 structures 5000 consisting of at least partially relaxed strained material, are epitaxially grown by using the islands 5134 of at least partially relaxed strained material as seeds. The material of structures 5000 could be the same as the material of islands 5134. Alternatively, it could be a different material having a compatible atomic lattice structure, such as III-N materials, II-VI or IV materials. Preferably, the structures 5000 are grown when the islands of material are transferred on the final substrate with a high viscosity layer. Then, any of the 3180, 3193, 5153 and 2151 layers may be totally removed. This last step could include a CMP and/or etching steps.

Once the 5134 layer of the top of the final structure, the InGaN re-growth could be achieved by epitaxy on the relaxed strained material. If the relaxed strained material is non polar, the re-growth can be achieved by epitaxy directly on the 5134 layer showed in the step S52. The same effects are achieved on structure 5200B except that structure 5200B further includes a hole 4191B deriving from hole 2140B.

The amount of relaxation of structures 5000, and correspondingly, islands 5134 of at least partially relaxed strained material can be precisely controlled by controlling the number of times the relaxation and thinning step S42 is carried out. Preferably, the islands are substantially relaxed at the end of the process flow such that the structure 5000 is also substantially relaxed. As the seed layer 4222 is only removed towards the end of the process, the occurrence of buckling can be prevented thanks to the remaining substrate 1110 during the relaxation step.

The process according to the embodiment and the variants of the present invention described above thus allows the number of steps to be reduced and while at the same time a relaxation of the strained III-V material is achieved wherein buckling can essentially be prevented. Furthermore, the present invention reduces the cracking and the delamination observed in the prior art, thanks to the presence of the first substrate during heating and relaxation.

What is claimed is:

1. A method of forming islands of at least partially relaxed strained material on a target substrate which comprises:
    forming islands of strained material over one face of a first substrate;

forming a seed layer on the first substrate before forming the islands of strained material;

implanting ionic species in a region within the seed layer on the first substrate, or in the first substrate, to form a weakened layer prior to bonding;

bonding the face of the first substrate to a target substrate; and thereafter, detaching the first substrate from the target substrate and at least partially relaxing the islands of the strained material by a first heat treatment, wherein the heat treatment for relaxing the strained layer causes the detachment of the first substrate at the weakened layer such that the detachment and relaxation occurs simultaneously with the islands of at least partially relaxed strained material bonded to the target substrate detached and physically moved away from the first substrate.

2. The method according to claim 1, which further comprises forming a layer of a gripping material over the islands.

3. The method according to claim 1, which further comprises forming a layer of relaxing material over the islands of the strained material.

4. The method according to claim 3, wherein the target substrate includes over its surface a layer of a bonding material, with the bonding of the face of the first substrate to the target substrate occurring between the layer of relaxing material and the layer of bonding material.

5. The method according to claim 4, wherein both the relaxing material and the bonding material comprise a material that flows at a glass transition temperature of 600 to 1000° C.

6. The method according to claim 5, wherein the bonding layer comprises a layer that absorbs electromagnetic irradiation.

7. The method according to claim 6, wherein the bonding layer is $Si_xN_y$:H and the relaxing material is a borophosphosilicate glass, the partially relaxing of the islands is in an elastic relaxation, and the islands have a size of about 300 nm by 300 nm, to few millimeters by few millimeters.

8. The method according to claim 5, wherein the partially relaxing of the islands comprises heating of the bonded first substrate and target substrate at about 600° C. to 1000° C. for about 2 to 6 hours.

9. The method according to claim 1 wherein the islands of the at least partially relaxed material have a surface topology that is less than 10 nm RMS and measured over a field of approximately 140 micrometers by 100 micrometers.

10. The method according to claim 1 wherein the first heat treatment includes a heating temperature rate of 1° C./min to 50° C./min.

11. The method according to claim 1, wherein the seed layer is a semiconductor material of silicon, GaN or another binary, ternary, or quaternary alloys of III-V material.

12. The method according to claim 1, wherein the strained material and seed layer that are detached from the first substrate have a bilayer thickness of 150-500 nm.

13. The method according to claim 1, which further comprises applying a second heat treatment at about the glass transition temperature of the relaxing layer after physically moving away the at least partially relaxed strained material from the first substrate.

14. The method according to claim 13, which further comprises thinning the seed layer.

15. The method according to claim 14, wherein the heating and thinning are repeated until the islands are substantially relaxed.

16. The method according to claim 15, wherein the layer of relaxing material is partially or completely patterned following the islands of strained material before thinning to help the complete relaxation.

17. The method according to claim 11, which further comprises forming trenches in the first substrate or in the seed layer to form the islands of strained material, wherein the weakened layer is formed below the trenches.

18. The method according to claim 1, wherein the strained material is strained InGaN including indium in an amount of between 3-20%, strained SiGe or strained III-N material, the first substrate or the target substrate, or both, is sapphire, silicon, SiC, or Ge, with the first and target substrates being identical or having a similar coefficient of thermal expansion.

19. The method according to claim 1, which further comprises bonding the islands of at least partially relaxed material to a final substrate and detaching the target substrate by laser lift off.

20. The method according to claim 19, wherein the at least partially relaxed islands are bonded to the final substrate by a non-compliant oxide layer having a glass transition temperature above 1000-1200° C.

21. The method according to claim 1 which further comprises providing a working layer of relaxed III-V, II-VI or IV material epitaxially grown on the islands of at least partially relaxed strained material to form a structure comprising the working on islands of at least partially relaxed strained material on a substrate.

22. The method of claim 21 which further comprises forming an optoelectronic or photovoltaic device in or on the working layer of the structure.

23. The method according to claim 4, wherein the layer of bonding material is partially or completely patterned following the islands of strained material before thinning to help the complete relaxation.

24. A method of forming islands of at least partially relaxed strained material on a target substrate which comprises:

forming a seed layer on one face of a first substrate;

forming islands of strained material on the seed layer;

implanting ionic species in a region either within the seed layer or in the first substrate to form a weakened layer prior;

bonding the islands of strained material of the first substrate to a target substrate to form a bonded structure; and applying a first heat treatment to the bonded structure to detach the first substrate from the target substrate at the weakened layer while simultaneously at least partially relaxing the islands of the strained material to thus form islands of at least partially relaxed strained material bonded to the target substrate and detached from the first substrate.

* * * * *